US011969691B1

United States Patent
Selimefendigil et al.

(10) Patent No.: US 11,969,691 B1
(45) Date of Patent: Apr. 30, 2024

(54) CLEAN WATER PRODUCTION WITH ENHANCED ELECTRICITY

(71) Applicant: KING FAISAL UNIVERSITY, Al-Ahsa (SA)

(72) Inventors: Fatih Selimefendigil, Al-Ahsa (SA); Damla Okulu, Al-Ahsa (SA)

(73) Assignee: KING FAISAL UNIVERSITY, Al-Ahsa (SA)

( * ) Notice: Subject to any disclaimer, the term of this patent is extended or adjusted under 35 U.S.C. 154(b) by 0 days.

(21) Appl. No.: 18/409,114

(22) Filed: Jan. 10, 2024

(51) Int. Cl.
*B01D 61/36* (2006.01)
*C02F 1/44* (2023.01)

(52) U.S. Cl.
CPC ....... *B01D 61/3641* (2022.08); *B01D 61/366* (2013.01); *C02F 1/447* (2013.01); *B01D 2313/367* (2022.08); *B01D 2317/02* (2013.01); *C02F 2201/009* (2013.01)

(58) Field of Classification Search
CPC .............. B01D 61/3641; B01D 61/366; B01D 2313/367; B01D 2317/02; C02F 1/447; C02F 2201/009
See application file for complete search history.

(56) References Cited

U.S. PATENT DOCUMENTS

| 9,278,315 | B2 | 3/2016 | Davis |
| 9,850,145 | B2 | 12/2017 | Thomas |
| 11,316,089 | B2 | 4/2022 | Melsert et al. |
| 2017/0107162 | A1* | 4/2017 | Duggal ................ B01D 61/246 |
| 2021/0384864 | A1* | 12/2021 | Wang ...................... F24S 25/70 |
| 2021/0384865 | A1 | 12/2021 | Wang et al. |

FOREIGN PATENT DOCUMENTS

| CN | 112624238 A | 4/2021 |
| CN | 214327182 U | 10/2021 |
| CN | 113860409 A | 12/2021 |
| CN | 115193262 A | 10/2022 |
| KR | 102228439 B1 | 3/2021 |
| WO | WO-2017164440 A1 * | 9/2017 ............ B01D 61/36 |
| WO | 2020056847 A1 | 3/2020 |

OTHER PUBLICATIONS

Machine translation of Kim et al., WO 2017/164440.*

(Continued)

*Primary Examiner* — Benjamin L Lebron
(74) *Attorney, Agent, or Firm* — Nath, Goldberg & Meyer; Richard C. Litman

(57) ABSTRACT

A clean water production system includes a photovoltaic panel and a first membrane distillation system having a first evaporation layer, first porous hydrophobic layer and first condensation layer. The first membrane distillation system is located under the photovoltaic panel. A second membrane distillation system has a second evaporation layer, second porous hydrophobic layer and second condensation layer. The second membrane distillation system is located under the first membrane distillation system. A thermoelectric generator is located under the second membrane distillation system converting heat to electricity.

11 Claims, 6 Drawing Sheets

(56) References Cited

OTHER PUBLICATIONS

Makanjuola, O., et al., "Numerical and experimental investigation of thermoelectric materials in direct contact membrane distillation", Energy conversion and management, 267, 115880. (Year: 2022).*

Makanjuola, O., et al., "Thermoelectric heating and cooling for efficient membrane distillation", Case studies in thermal engineering, 28, 101540. (Year: 2021).*

Selimefendigil, F., et al., "Photovoltaic thermal management by combined utilization of thermoelectric generator and power-law-nanofluid-assisted cooling channel", Sustainability, 15, 5424. (Year: 2023).*

Wang, W., Shi, Y., Zhang, C. et al. "Simultaneous production of fresh water and electricity via multistage solar photovoltaic membrane distillation". Nat Commun 10, 3012 (2019).

Mohammed Rabie, Abdallah Y.M. Ali, Essam M. Abo-Zahhad, M.F. Elkady, A.H. El-Shazly, Mohamed S. Salem, Ali Radwan, Saeid Rajabzadeh, Hideto Matsuyama, Ho kyong Shon, "New hybrid concentrated photovoltaic/membrane distillation unit for simultaneous freshwater and electricity production", Desalination, vol. 559, 2023.

* cited by examiner

CLEAN WATER PRODUCTION WITH ENHANCED ELECTRICITY

BACKGROUND

1. Field

The present disclosure relates clean water production and particularly to clean water production using photovoltaic, membrane distillation and thermoelectric sources.

2. Description of the Related Art

Insufficiency of energy and usable water resources is becoming a major problem for future generations. Systems designed using solar energy aim to be a solution to these problems. Solar energy designs allow the production of both electricity and usable clean water.

SUMMARY

Production of both electricity and clean water is achieved simultaneously by integrating a multistage membrane distillation (MSMD) system on the bottom surface of a concentrated photovoltaic (CPV) panel. The distillation of brine takes place in two stages.

A clean water production system, in one embodiment, includes a photovoltaic panel and a first membrane distillation system having a first evaporation layer, a first porous hydrophobic layer and a first condensation layer. The first membrane distillation system is located under the photovoltaic panel. A second membrane distillation system has a second evaporation layer, a second porous hydrophobic layer and a second condensation layer. The second membrane distillation system is located under the first membrane distillation system. A thermoelectric generator is located under the second membrane distillation system converting heat to electricity.

The thermoelectric generator has a porous material channel allowing fluid to flow through a chiller to a nanofluid tank.

An insulator surrounds the first membrane distillation system and the second membrane distillation system.

The second evaporation layer receives brine from a brine tank and allows flow of brine from the second evaporation layer to the first evaporation layer.

The first condensation layer and the second condensation layer allows fluid flow to a clean water tank.

The first evaporation layer allows fluid flow into a concentrated tank.

A clean water production method, in another embodiment, includes producing heat through a photovoltaic panel; receiving brine through a first evaporation layer of a first membrane distillation system located under the photovoltaic layer, and allowing brine to flow to a second evaporation layer of a second membrane distillation system located under the first membrane distillation system; allowing brine to flow through a first porous hydrophobic layer and first condensation layer of the first membrane distillation system; allowing brine to flow through a second porous hydrophobic layer and second condensation layer of the second membrane distillation system; allowing clean water to flow from the first condensation layer and the second condensation layer to a clean water tank; and generating electricity with a thermoelectric generator located under the second membrane distillation system.

Fluid flows through a porous material channel of the thermoelectric generator and through a chiller to a nanofluid tank.

Brine is received from a brine tank at the first evaporation layer and brine flows from the first evaporation layer to the second evaporation layer.

Fluid flows to a condensation tank from the first condensation layer and the second condensation layer.

Fluid also flows from the first evaporation layer to a concentrated tank.

These and other features of the present subject matter will become readily apparent upon further review of the following specification.

BRIEF DESCRIPTION OF THE DRAWINGS

Similar reference characters denote corresponding features consistently throughout the attached drawings.

DETAILED DESCRIPTION OF THE PREFERRED EMBODIMENTS

Distillation of brine takes place in two stages. There are four layers in the membrane distillation system: heat conduction, porous hydrophobic membrane, evaporator and condenser. The heat absorbed by a concentrated photovoltaic (CPV) panel is transmitted to the evaporator layer through the heat conduction layer. Brine, which passes into the vapor phase in the evaporator section, is distilled in the porous hydrophobic membrane system and condensation occurs in the condenser section, completing clean water production.

With the membrane system, each of which works in this way, the CPV panel is prevented from reaching very high temperatures and a performance increase is achieved in electricity production as the CPV panel becomes more efficient with the removal of the heat. The thermoelectric generator (TEG) is assembled on the bottom surface of the membrane distillation system in order to ensure the recovery of waste heat in the system operating in this way. Water that cannot be distilled from salt (concentrated water) is conveyed to a tank to prevent salt accumulation in the membrane system. In addition, the produced clean water is transferred to two different tanks and nanoparticles are added to one of these tanks. The clean water, which is cooled before entering the tank, is a nanofluid with high thermophysical properties by adding nanoparticles in the tank and is a part of the heat sink system required for TEG's electricity generation.

A porous media channel has been designed in the heat sink system and the cooling performance increases with the nanofluid flow. The heat source of TEG will be created by waste heat from the membrane distillation system. The nanofluid exiting the heat sink design at high temperature is cooled again before entering the nanofluid tank, thus ensuring the continuity of the TEG/channel system. In the CPV/MSMD design, the MSMD is covered with insulation material and heat losses are not allowed.

Figure 1:
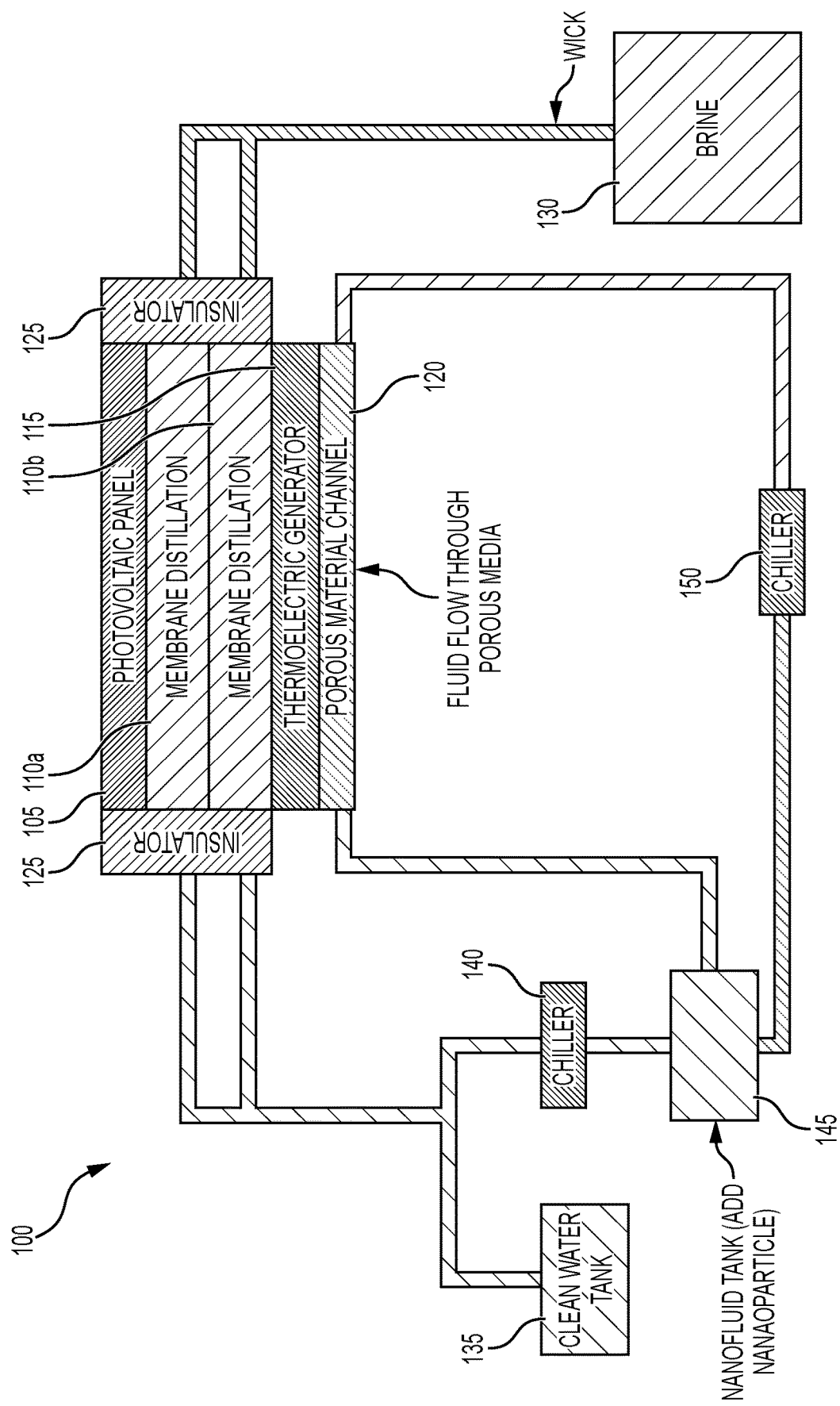
FIG. 1 is a schematic diagram of a concentrated photovoltaic, membrane distillation, thermoelectric channel system

FIG. 1 is a schematic diagram of a concentrated photovoltaic, membrane distillation, thermoelectric channel system 100. The system includes a photovoltaic panel 105, membrane distillation system 110a,110b, a thermoelectric generator 115 and a porous material channel 120. The system 100 is insulated with insulators 125 around membrane distillate system 110a, 110b.

Brine is supplied to the system 100 from a brine tank 130. The brine is heated by the photovoltaic panel 105 and flows through the membrane distillation system 110a,110b. The thermoelectric generator 115 converts heat being generated within the system 100 into electricity. A portion of the clean water from the membrane distillation system 110a,110b is stored into a clean water tank 135. Another portion of the clean water flows through a chiller 140 to a nanofluid tank 145 where nano particles are added to the nanofluid. The combined clean water and nanoparticles flow through a porous material channel 120 acting as a heat sink for the thermoelectric generator 115. The heated clean water and nanoparticles flow through a chiller 150 and back to the nanofluid tank 145.

Figure 2:
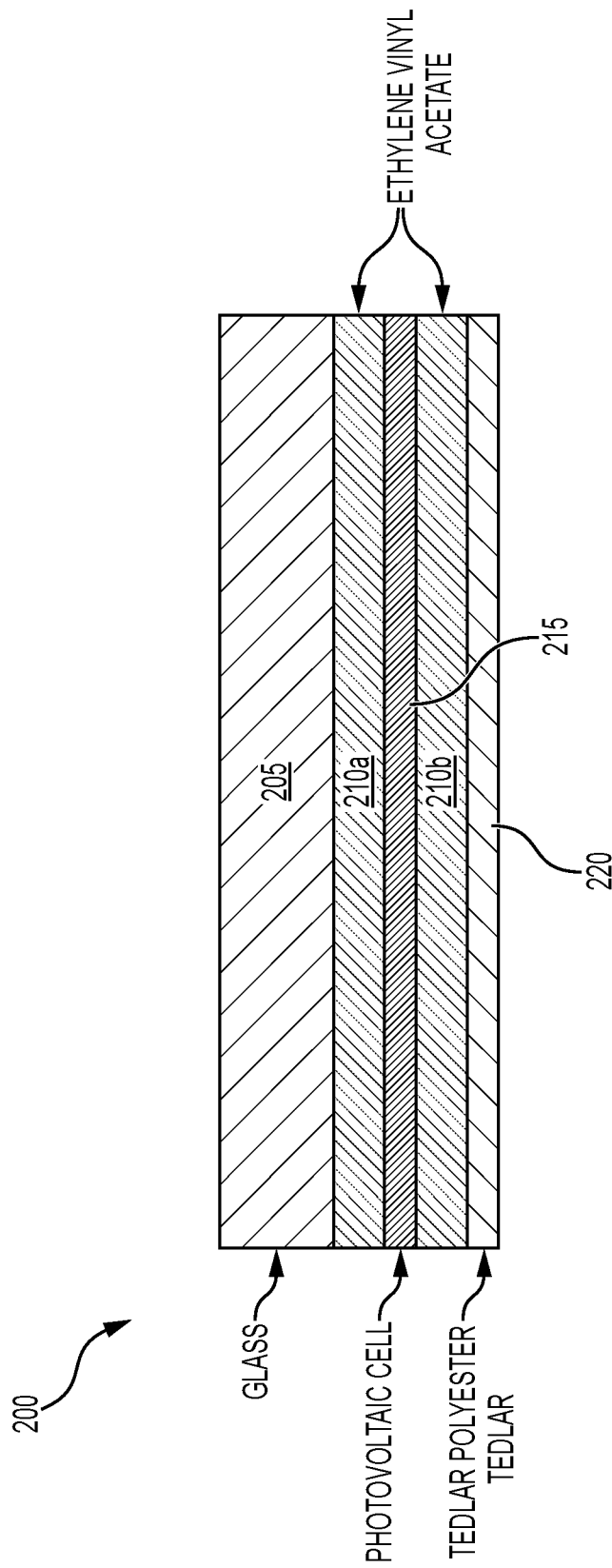
FIG. 2 is an illustration of a concentrated photovoltaic panel (CPV).

FIG. 2 is an illustration of a concentrated photovoltaic panel (CPV) 200. It includes a glass layer 205 followed by ethylene vinyl acetate layers 210a,210b with a photovoltaic cell 215 sandwiched between the vinyl acetate layers 210a, 210b. The final bottom layer is a tedlar polyester tedlar layer 220.

Figure 3:
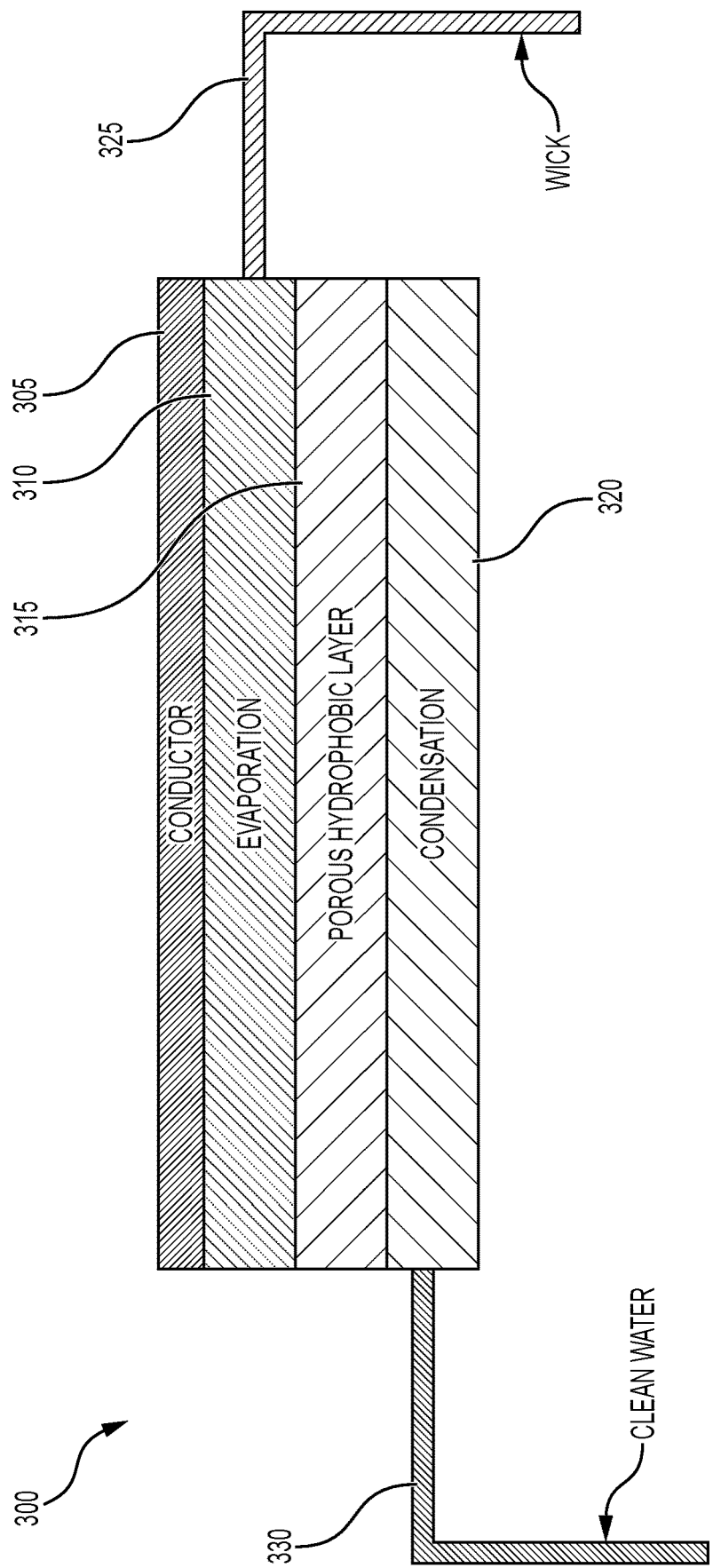
FIG. 3 is an illustration of a membrane distillation system.

FIG. 3 is an illustration of a membrane distillation system 300. It includes a conductor 305, an evaporation layer 310, a porous hydrophobic layer 315 and a condensation layer 320. Brine enters the system 300 through a wick 325 into the evaporation layer 310. The brine flows through the porous hydrophobic layer 315 to the condensation layer 320. Clean water flows from the condensation layer 320 through an outlet 330.

Figure 4:
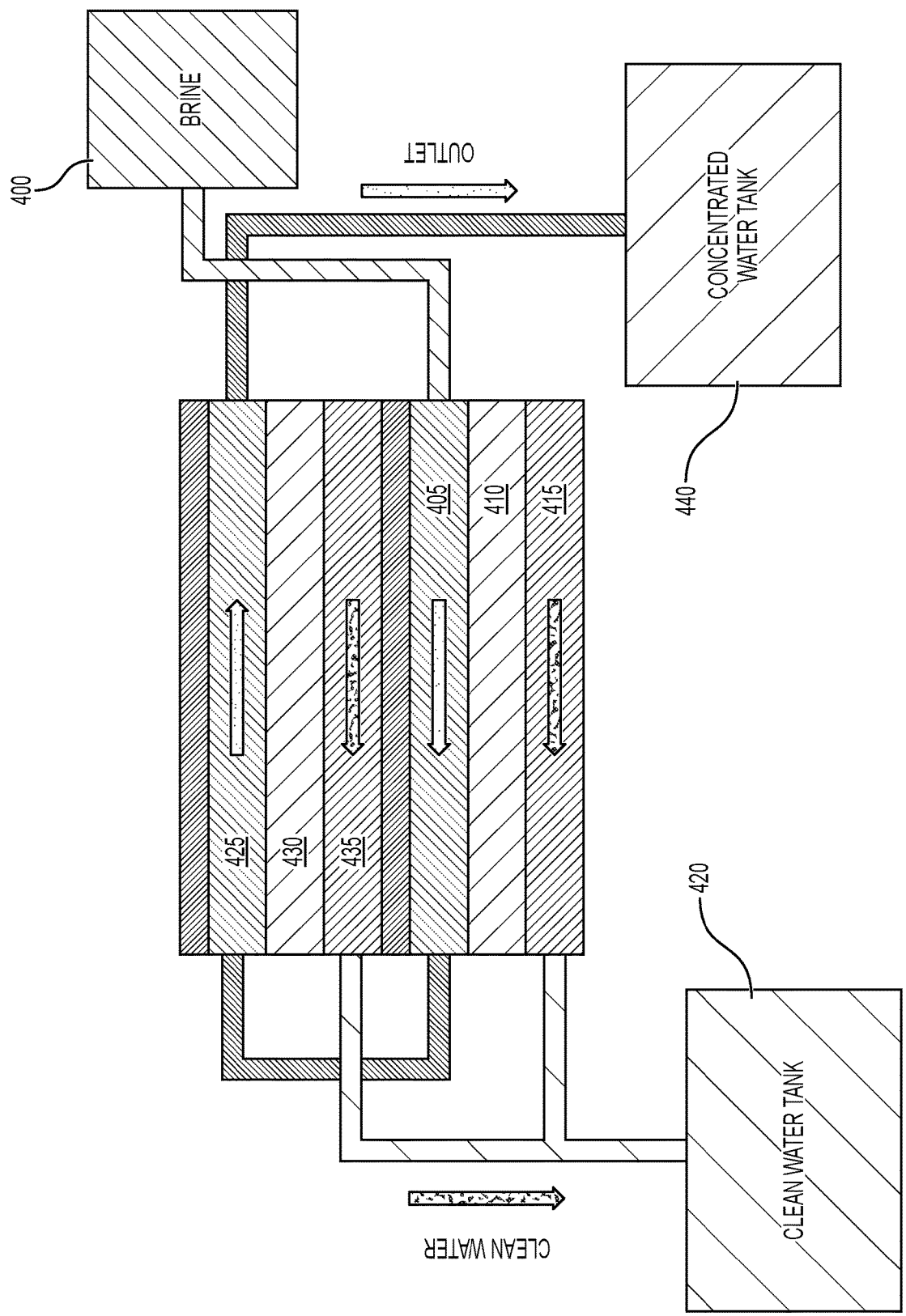
FIG. 4 is a schematic diagram of a cross flow mode of membrane distillation.

FIG. 4 is a schematic diagram of a cross flow mode of membrane distillation. Brine flows from a brine tank 400 to an evaporation layer 405 of a first membrane distillation system. The brines then flows through a porous hydrophobic layer 410 of the first membrane distillation system to condensation layer 415. Clean water flows from the condensation layer 415 to a clean water tank 420.

Brine also flows from evaporation layer 405 to evaporation layer 425 of a second membrane distillation system. The brine then flows through a porous hydrophobic layer 430 of the second membrane distillation member to condensation layer 435. Clean water flows from the condensation layer 435 to the clean water tank 420.

Water that cannot be distilled from salt (concentrated water) is conveyed from the evaporation layer 425 of the second membrane distillation system to a concentration water tank 440 to prevent salt accumulation in the first and second membrane systems.

Figure 5:
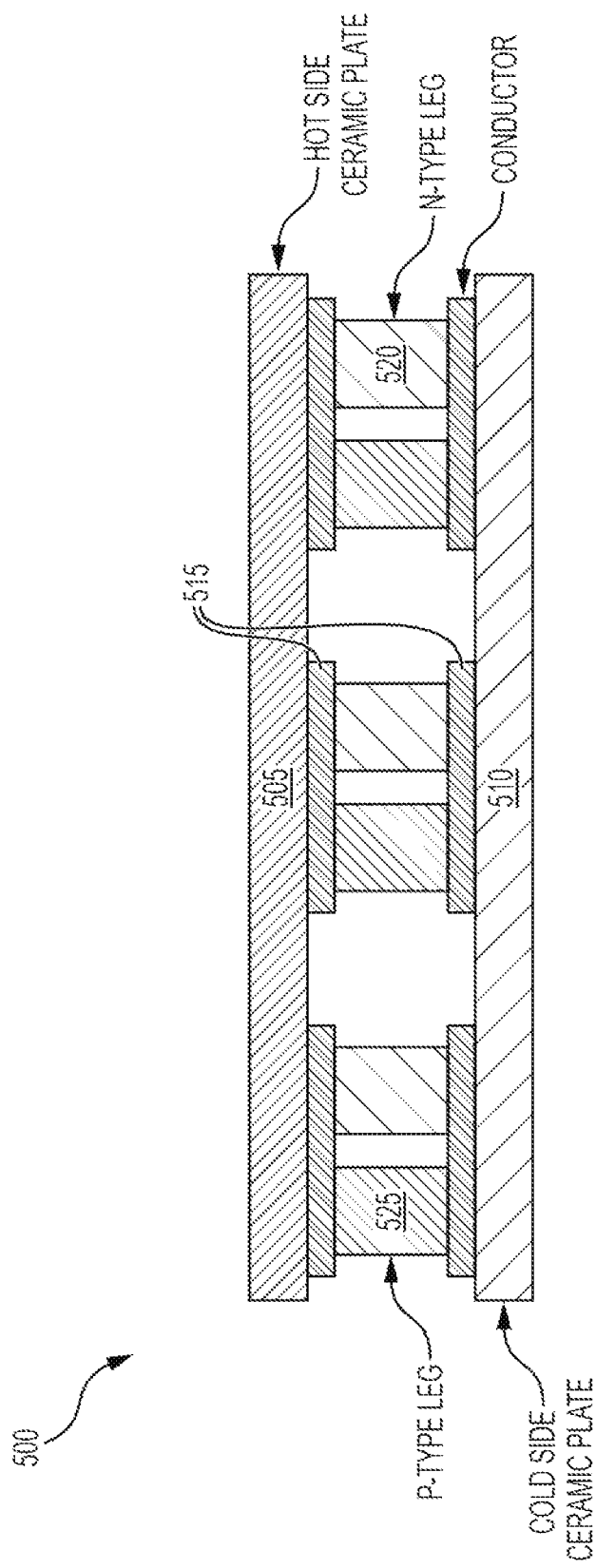
FIG. 5 is an illustration of a thermoelectric generator.

FIG. 5 is an illustration of a thermoelectric generator 500. Thermoelectric generator 500 includes a hot side ceramic plate 505 and a cold side ceramic plate 510. Conductors 515 are located on each of the hot side ceramic plate 505 and cold side ceramic plate 510. N-type legs 520 and P-type legs 525 are interposed between the conductors 515.

Figure 6:
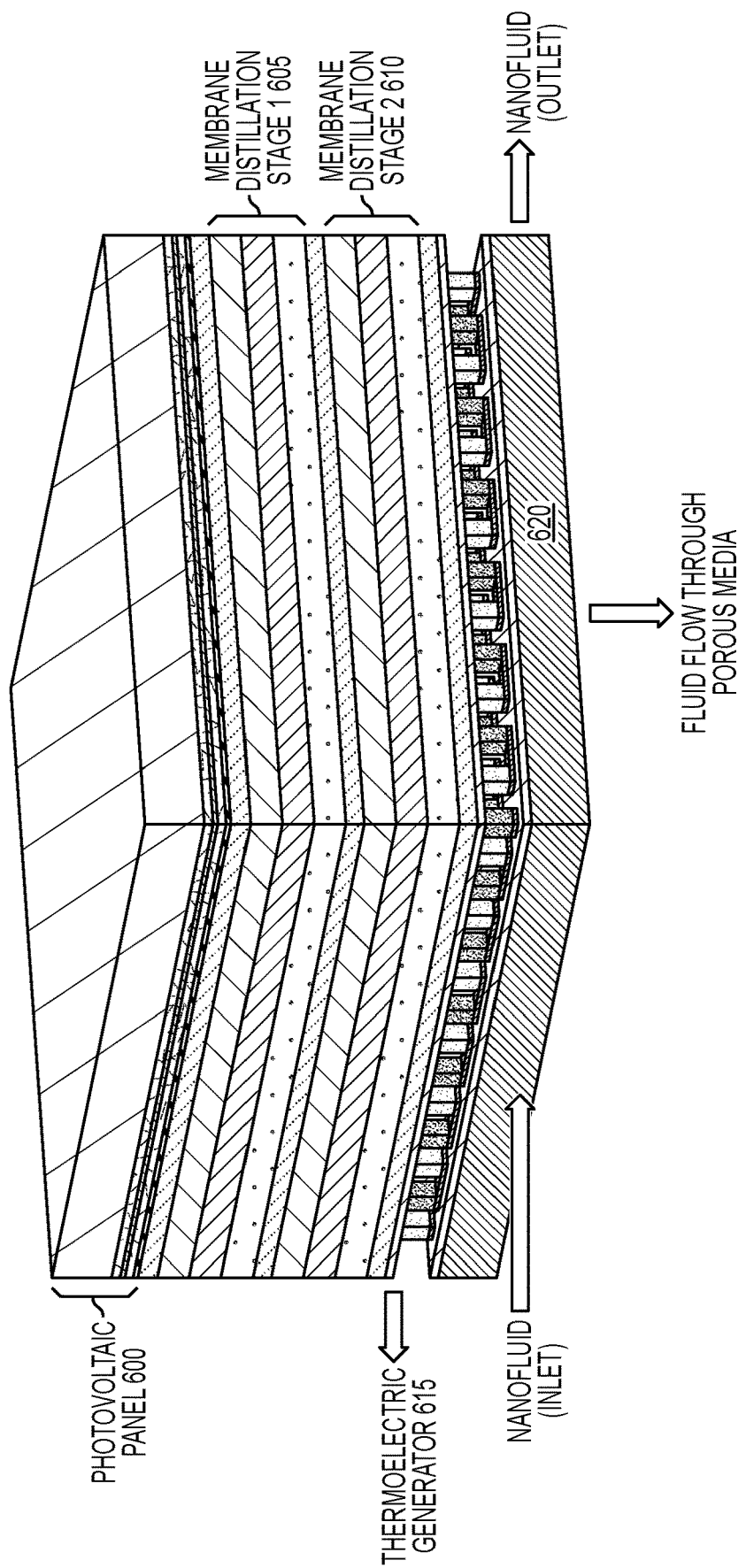
FIG. 6 is a schematic diagram of concentrated photovoltaic panel, membrane distillation system and thermoelectric design.

FIG. 6 is a schematic diagram of concentrated photovoltaic panel, membrane distillation system and thermoelectric design. A photoelectric panel 600 is the top layer. Middle layers include two membrane distillation systems 605 and 610. A thermoelectric generator 615 is located on the bottom layer. A nanofluid layer 620 is located beneath the thermoelectric generator 615 and acts as a heat sink.

It is to be understood that the present subject matter is not limited to the specific embodiments described above, but encompasses any and all embodiments within the scope of the generic language of the following claims enabled by the embodiments described herein, or otherwise shown in the drawings or described above in terms sufficient to enable one of ordinary skill in the art to make and use the claimed subject matter.

We claim:

1. A clean water production system, comprising:
   a photovoltaic panel;
   a first membrane distillation system having a first evaporation layer, a first porous hydrophobic layer and a first condensation layer, the first membrane distillation system located under the photovoltaic panel;
   a second membrane distillation system having a second evaporation layer, a second porous hydrophobic layer and a second condensation layer, the second membrane distillation system located under the first membrane distillation system; and
   a thermoelectric generator located under the second membrane distillation system converting heat to electricity.

2. The clean water production system as recited in claim 1, wherein the thermoelectric generator has a porous material channel allowing fluid to flow through a chiller to a nanofluid tank.

3. The clean water production system as recited in claim 1, further comprising an insulator surrounding the first membrane distillation system and the second membrane distillation system.

4. The clean water production system as recited in claim 1, wherein the second evaporation layer receives brine from a brine tank and allows flow of brine from the second evaporation layer to the first evaporation layer.

5. The clean water production system as recited in claim 1, the first condensation layer and the second condensation layer allows fluid flow to a clean water tank.

6. The clean water production system as recited in claim 1, wherein the first evaporation layer allows fluid flow into a concentrated tank.

7. A clean water production method, comprising:
   producing heat through a photovoltaic panel;
   receiving brine through a first evaporation layer of a first membrane distillation system located under the photovoltaic layer, and allowing brine to flow to a second evaporation layer of a second membrane distillation system located above the first membrane distillation system;
   allowing brine to flow through a first porous hydrophobic layer and first condensation layer of the first membrane distillation system;
   allowing brine to flow through a second porous hydrophobic layer and second condensation layer of the second membrane distillation system;
   allowing clean water to flow from the first condensation layer and the second condensation layer to a clean water tank; and
   generating electricity with a thermoelectric generator located under the second membrane distillation system.

8. The method as recited in claim 7, further comprising allowing fluid to flow through a porous material channel of the thermoelectric generator and through a chiller to a nanofluid tank.

9. The method as recited in claim 7, further comprising receiving brine from a brine tank at the first evaporation layer and allowing flow of brine from the first evaporation layer to the second evaporation layer.

10. The method as recited in claim 7, allowing fluid to flow to a condensation tank from the first condensation layer and the second condensation layer.

11. The method as recited in claim 7, further comprising allowing fluid flow from the first evaporation layer to a concentrated tank.

\* \* \* \* \*